US012696736B2

(12) United States Patent
Mandalapu et al.

(10) Patent No.: US 12,696,736 B2
(45) Date of Patent: Jul. 28, 2026

(54) CHIP-ON-WAFER FACE-TO-BACK HYBRID BONDING WITHOUT SUPPORT CARRIER

(71) Applicant: Advanced Micro Devices, Inc., Santa Clara, CA (US)

(72) Inventors: Chandra Sekhar Mandalapu, Ft. Collins, CO (US); Raja Swaminathan, Austin, TX (US); Liwei Wang, Austin, TX (US); John Wuu, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 370 days.

(21) Appl. No.: 18/478,746

(22) Filed: Sep. 29, 2023

(65) Prior Publication Data

US 2025/0112047 A1 Apr. 3, 2025

(51) Int. Cl.
H01L 23/02 (2006.01)
H10P 72/70 (2026.01)
H10P 90/00 (2026.01)
*H10W 72/00* (2026.01)

(52) U.S. Cl.
CPC .......... H10P 90/1914 (2026.01); H10P 72/74 (2026.01); *H10W 72/019* (2026.01); *H10W 72/01938* (2026.01); *H10W 72/0198* (2026.01)

(58) Field of Classification Search
CPC . H01L 21/2007; H01L 21/6835; H01L 24/03;
H01L 24/97; H01L 2224/0345; H01L 2224/0391; H01L 2224/97; H01L 24/08; H01L 24/80; H01L 24/94
USPC ........................................ 257/678; 438/455
See application file for complete search history.

(56) References Cited

U.S. PATENT DOCUMENTS

2015/0249065 A1* 9/2015 Pagaila ............... H01L 23/3157
257/737
2024/0387452 A1* 11/2024 Chen ...................... H01L 24/08

* cited by examiner

*Primary Examiner* — Theresa T Doan
(74) *Attorney, Agent, or Firm* — Greenberg Traurig, LLP

(57) ABSTRACT

A hybrid bonding method includes fabricating plural semiconductor devices in a region of a bottom wafer adjacent to a front surface thereof, fusion bonding the front surface to a carrier substrate, thinning the bottom wafer opposite to the front surface to expose conductive regions of the semiconductor devices, forming a dielectric layer over a backside of the semiconductor devices, forming openings in the dielectric layer to expose the conductive regions, forming metal pads within the openings, dicing the bottom wafer and the carrier substrate to singulate the plural semiconductor devices, bonding the dielectric layer overlying the backside of the semiconductor devices to a dielectric layer overlying a front surface of a top wafer, bonding the metal pads within the openings in the dielectric layer to metal pads overlying the front surface of the top wafer, and removing the carrier substrate from the front surface of the bottom wafer.

20 Claims, 4 Drawing Sheets

200

201 — BD WoW/CoW FB to Carrier

202 — BD Wafer Thinning → TSV Reveal

203 — BPM Pads (HB Ready)

204 — PD (Carrier+BD Wafer); Thin Carrier

205 — Top Wafer (HB Ready)

206 — CoW Hybrid Bond

207 — Thin → GF Oxide Dep

208 — Passivation Etch/Al Pad Open (Optional CPI)

209 — µBumps → CPI

CHIP-ON-WAFER FACE-TO-BACK HYBRID BONDING WITHOUT SUPPORT CARRIER

BACKGROUND

Die-to-wafer (D2W) bonding processes can enable next-generation devices and provide improved device performance but may be limited by bonding tool technology and the manufacturing challenges imposed by thinner (<20 micrometers) and correspondingly fragile die. Dual carrier paradigms are oftentimes used to enable die-to-wafer architectures, but such approaches typically add cycle time and cost and may adversely affect yield.

BRIEF DESCRIPTION OF THE DRAWINGS

The accompanying drawings illustrate a number of example implementations and are a part of the specification. Together with the following description, these drawings demonstrate and explain various principles of the present disclosure.

Figure 1:
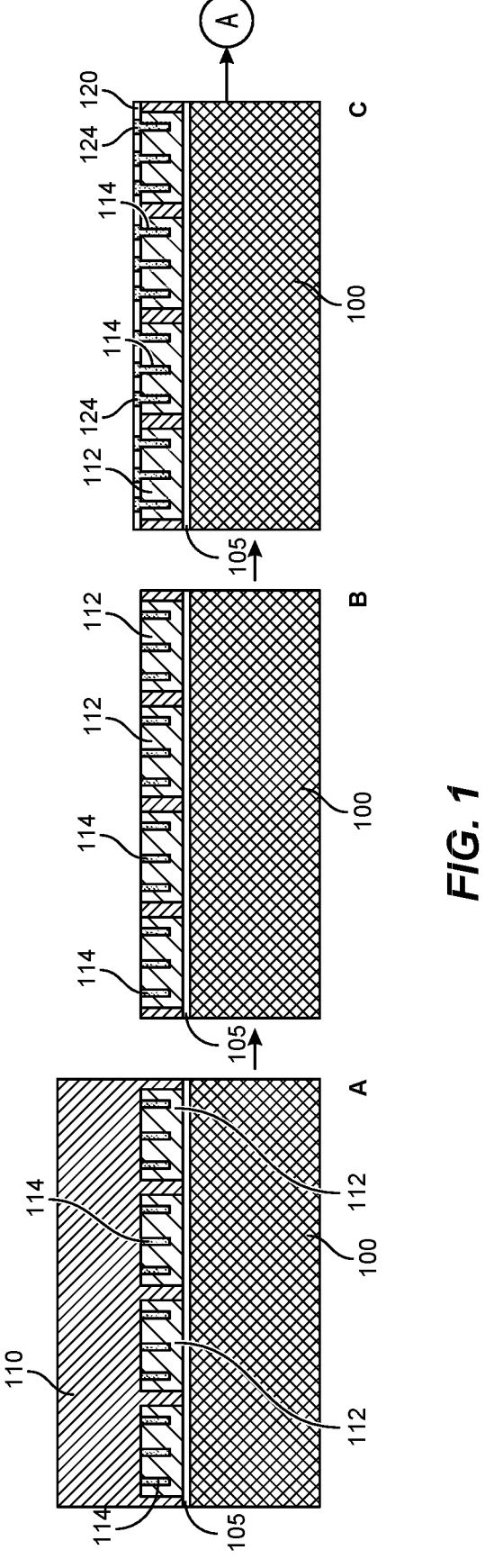
FIGS. 1A-1I illustrate an example process flow for forming a chip-on-wafer architecture using a hybrid bonding process according to some implementations.
Figure 1:
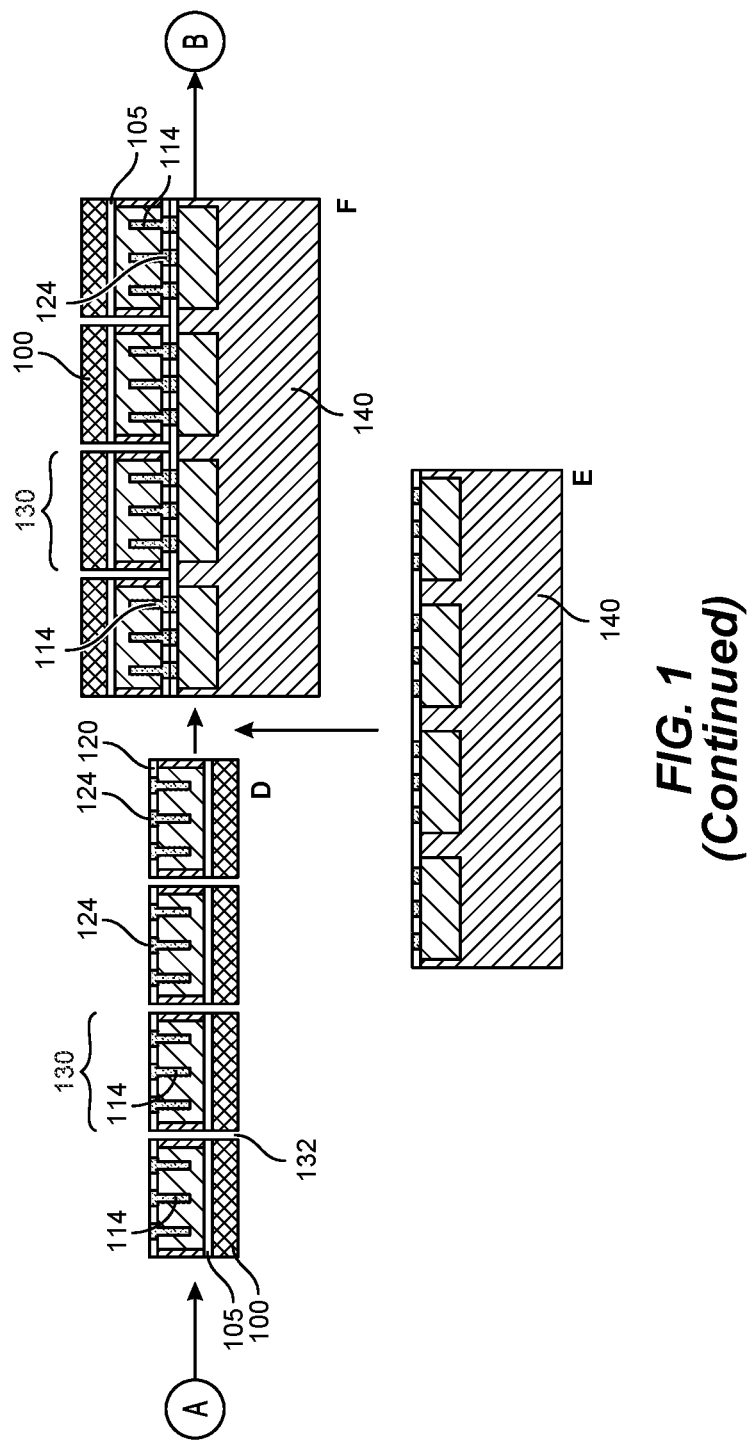
Figure 1:
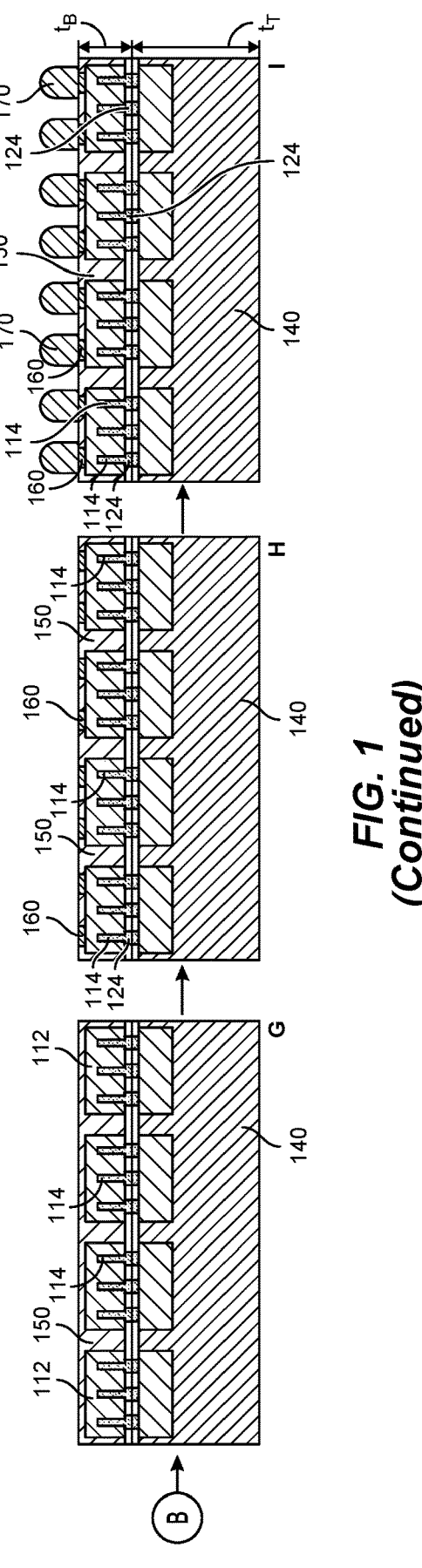

Throughout the drawings, identical reference characters and descriptions indicate similar, but not necessarily identical, elements. While the example implementations described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

Hybrid bonding methods vertically connect chip-to-wafer (C2W) or wafer-to-wafer (W2W) architectures via closely spaced conductive pads. In particular, the development of chip-to-wafer processing can advance heterogeneous integration, including the assembly of die having different sizes, functions, and design rules. As will be appreciated, hybrid bonding can enable advanced 3D stacking and, in turn, the production of devices with higher I/O, greater memory density, expanded bandwidth, and increased power and efficiency.

Notwithstanding recent developments, it would be advantageous to provide economical face-to-back hybrid bonding processes. In accordance with certain implementations, disclosed is a face-to-back (F2B) die-to-wafer (D2W) hybrid bonding paradigm where the carrier wafer supporting the top die is eliminated. That is, by eliminating the carrier oxide bond to the top wafer, thermal resistance through the assembled package can be decreased and the attendant increase in heat dissipation can improve device performance.

In comparative methods and architectures, in addition to the bottom die, the top die are also supported through manufacturing by a carrier wafer. In such comparative methods, each of a top wafer and a bottom wafer are supported by a respective carrier wafer, and the top and bottom die are singulated, co-aligned, and bonded. In contrast, according to various implementations, a dicing step is applied to only the supported bottom die, which are singulated and then aligned and bonded to corresponding die on the top wafer.

As used herein, "fusion bonding" refers to a technique for joining two wafers via dielectric layers formed on each wafer surface without the use of an intermediate adhesive. Fusion bonding can include a plasma and/or thermal treatment. "Hybrid bonding" is an extension of fusion bonding where both the dielectric layers and embedded metal pads are disposed along the bond interface. With hybrid bonding, metal pads can be processed in parallel with the dielectric layers, allowing the dielectric layers to be pre-bonded at low temperature, while electrical connections can be achieved during annealing via metal diffusion bonding, for example.

A semiconductor package includes a bottom semiconductor device having an active surface and a back surface, a through silicon via (TSV) communicating from the active surface to the back surface, a bottom bond pad metal contact embedded in a bottom oxide layer overlying the back surface and coupled to the through silicon via, a top semiconductor device having an active surface and a back surface, and a top bond pad metal contact embedded in a top oxide layer overlying the active surface of the top semiconductor device, where the top semiconductor device and the bottom semiconductor device are positioned face-to-back with the top bond pad metal contact bonded to the bottom bond pad metal contact and the top oxide layer bonded to the bottom oxide layer.

In some implementations, the bottom semiconductor device can be laterally enveloped by a passivation layer and/or the top semiconductor device can be formed on and laterally enveloped by a top semiconductor wafer.

The semiconductor package can include metal contacts overlying the active surface of the bottom semiconductor device. A thickness of the bottom semiconductor device can range from approximately 15 micrometers to approximately 30 micrometers. In accordance with particular implementations, the semiconductor package is free of a carrier wafer.

A further semiconductor package includes a bottom die having a conductive via extending through the bottom die, an oxide layer overlying a back surface of the bottom die, a bond pad metal contact embedded in the oxide layer and communicating with the conductive via, a top die having an oxide layer overlying a front surface of the top die, and a bond pad metal contact embedded in the oxide layer, where the top die and the bottom die are positioned face-to-back with the top bond pad metal contact bonded to the bottom bond pad metal contact and the top oxide layer bonded to the bottom oxide layer.

A method of manufacturing a semiconductor package includes fabricating a plurality of semiconductor devices in a region of a bottom wafer adjacent to a front surface of the bottom wafer, fusion bonding the front surface of the bottom wafer to a carrier substrate, thinning the bottom wafer opposite to the front surface to expose conductive regions of the semiconductor devices, forming a dielectric layer over a backside of the semiconductor devices, forming openings in the dielectric layer to expose the conductive regions, forming bond pad metal pads within the openings in the dielectric layer and in electrical contact with respective ones of the conductive regions, dicing the bottom wafer and the carrier substrate to singulate the plurality of semiconductor devices and form a plurality of die, bonding the dielectric layer overlying the backside of the semiconductor devices to a dielectric layer overlying a front surface of a top wafer, bonding the bond pad metal pads within the openings in the dielectric layer to metal pads overlying the front surface of the top wafer, and removing the carrier substrate from the front surface of the bottom wafer.

Suitable carrier substrate can include a semiconductor wafer. An example method of thinning the bottom wafer includes chemical mechanical polishing, and an example method of dicing the bottom wafer and the carrier substrate includes laser cutting. In some implementations, a thickness of the die can range from approximately 15 micrometers to approximately 30 micrometers. Adjacent die on the bottom wafer can be separated by a passivation layer and adjacent die on the top wafer can be separated a portion of the top wafer.

The method can additionally include forming a passivation layer over a front surface of the semiconductor devices and within gaps between adjacent semiconductor devices, forming openings within the passivation layer and forming metal contacts within the openings and in electrical contact with respective ones of the semiconductor devices, and forming a solder bump over each metal contact.

Disclosed is a face-to-back (F2B) die-to-wafer (D2W) hybrid bonding paradigm where the carrier wafer supporting the top die is eliminated. This approach will decrease cycle time and reduce process costs due to fewer process steps, and improve thermal performance in the resulting architecture by locating the top die closer to an associated heat sink. In an example method, bottom and top die are metallized and bonded across a hybrid interface, where the bottom die are disposed over and supported by a carrier wafer and the top die are formed on and supported by a semiconductor substrate. Following hybrid bonding, the single carrier wafer is removed and the resulting semiconductor package is free of a carrier wafer.

Features from any of the implementations described herein can be used in combination with one another in accordance with the general principles described herein. These and other implementations, features, and advantages will be more fully understood upon reading the following detailed description in conjunction with the accompanying drawings and claims.

The present disclosure is generally directed to methods for chip-on-wafer face-to-back hybrid bonding. An example hybrid bonding process and the associated structures are illustrated schematically in FIG. 1. A flowchart summarizing a method for chip-on-wafer face-to-back hybrid bonding is shown in FIG. 2.

Figure 2:
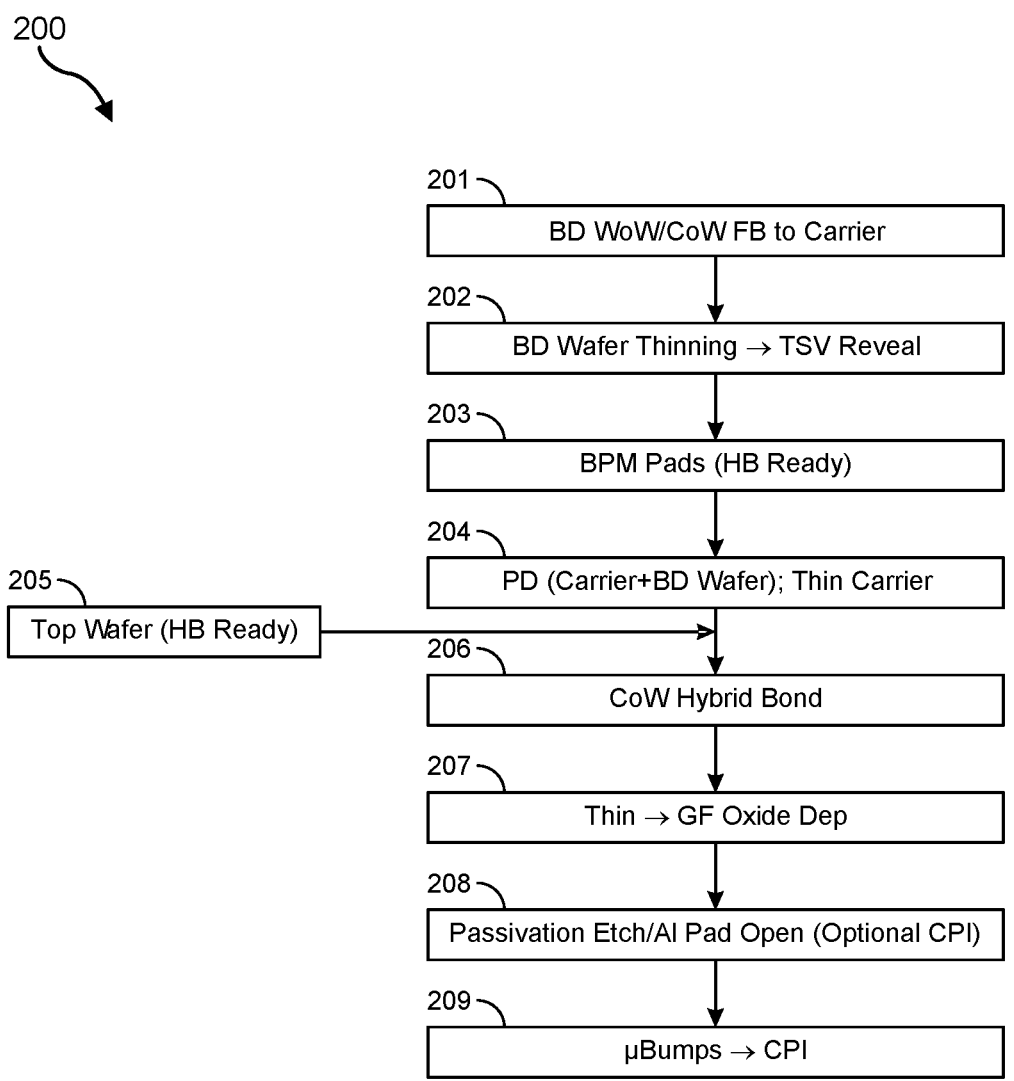
FIG. 2 is a flowchart outlining an exemplary method for forming a chip-on-wafer architecture according to some implementations.

Turning to FIG. 1, an exemplary chip-on-wafer face-to-back hybrid bonding process is depicted in a series of cross-sectional schematic views. Referring to FIG. 1A, a carrier wafer 100 supports and is fusion bonded to a bottom wafer 110. Carrier wafer 100 can include a semiconductor wafer (e.g., a silicon or gallium arsenide wafer) or a glass substrate. The wafer-on-wafer fusion bond 105 can be formed by applying a compressive force to the carrier wafer 100 and the bottom wafer 110 at a suitable temperature and pressure to facilitate a silanol condensation reaction between the oxide surfaces of the respective wafers. Oriented face down, bottom wafer 110 includes one or more active device areas 112 located proximate to the carrier wafer 100. By way of example, active device areas 112 can include a semiconductor device such as transistors, diodes, photovoltaic cells, and the like. Through silicon vias (TSVs) 114 extend through the active areas 112 toward the back of the bottom wafer 110.

Referring to FIG. 1B, using grinding and/or polishing techniques, such as chemical mechanical polishing (CMP), a portion of the bottom wafer 110 is removed to reveal TSVs 114. Thereafter, electrical connections can be made to the TSVs 114 using, for example, a Damascene process. Such a process can include forming a bond pad metal oxide layer 120 over the structure of FIG. 1B, patterning and etching openings in the oxide layer 120 to expose the TSVs 114, forming a conductive layer over the oxide layer 120 and within the openings, and removing the overburden to form embedded bond pad metal (BPM) contacts 124, as illustrated in FIG. 1C. In accordance with various implementations, oxide layer 120 and BPM contacts 124 can be formed using any suitable deposition technique, including, for example, chemical vapor deposition (CVD), such as low pressure chemical vapor deposition (LPCVD), physical vapor deposition (PVD), or atomic layer deposition (ALD). Chemical mechanical polishing can be used to remove excess bond pad metal.

Turning to FIG. 1D, individual die 130 can be formed by segmenting the bottom wafer 110 along dicing lanes 132 between active areas 112 using laser dicing, plasma dicing, or another suitable cutting technique, and thinning the carrier wafer 100. In an alternate approach, dicing and the formation of individual die 130 can precede the act of fusion bonding shown in FIG. 1A. Referring to FIGS. 1E and 1F, segmented bottom wafer 110 can be flipped face up and aligned with a face up top wafer 140 in a face-to-back architecture and the top and bottom wafers can be hybrid bonded. The hybrid bonding can include forming electrical connections between the top and bottom wafers, such as between respective bond pad metal (BPM) contacts.

In accordance with various implementations, the intermediate chip-on-wafer (CoW) architecture of FIG. 1F includes just a single segmented carrier wafer 100, i.e., supporting the bottom die 130 during the act of hybrid bonding, whereas the top die are integral with the top wafer 140 and are not supported by a carrier wafer. That is, whereas dicing of the bottom wafer precedes the act of hybrid bonding, the top wafer 140 is not segmented and die within the top wafer 140 are embedded in the top wafer material rather than a gap fill oxide.

Referring to FIG. 1G, remaining portions of the carrier wafer 100 can be removed, e.g., using grinding and CMP, to expose the front side of the bottom wafer 110 and a gap fill oxide layer 150 can be formed over and between adjacent die 130. The gap fill oxide layer 150 can be formed by plasma enhanced atomic layer deposition, for example. The gap fill oxide layer 150 can be planarized and conductive contacts can be formed to chosen active areas 112 within selected die 130, as shown in FIG. 1H. By way of example, conductive contacts can include metal pads 160. A method of forming the metal pads 160 can include patterning and etching openings in the gap fill oxide layer 150 to expose active areas 112, forming a conductive layer over the gap fill oxide layer 120 and within the openings, and removing the excess conductive material.

In certain implementations, a thickness ($t_B$) of the bottom die 130 can range from approximately 15 micrometers to approximately 30 micrometers, e.g., approximately 20 micrometers, and a thickness ($t_T$) of the top wafer 140, including the top die, can range from approximately 770 micrometers to approximately 790 micrometers, e.g., approximately 785 micrometers.

Referring to FIG. 1I, metal pads 160 can be electrically coupled to solder bumps 170, which can be configured to form electrical connections to a power source or ground, such as through connections made to a printed circuit board (not shown). As will be appreciated, a carrier wafer such as carrier wafer 100 or portions thereof is absent from the chip-on-wafer architecture of FIG. 1I, such that a corresponding semiconductor package is free of a carrier wafer.

FIG. 2 is a flowchart outlining a chip-on-wafer face-to-back hybrid bonding process flow according to certain implementations. An example method 200 includes orienting a bottom wafer with bottom die (BD) face down and fusion bonding (FB) the bottom wafer to a carrier substrate using a wafer-on-wafer (WoW) or chip-on-wafer (CoW) methodology (201), thinning the bottom wafer to expose through silicon via (TSV) contacts to the bottom die (202), forming bond pad metal (BPM) conductive pads over exposed TSVs to prepare the bottom wafer for hybrid bonding (203), plasma dicing (PD) the carrier substrate and bottom die wafer and thinning the carrier substrate (204), introducing a hybrid bond-ready top wafer (205), re-orienting the bottom wafer face up and hybrid bonding the top wafer and singulated bottom wafer in a face-to-back architecture (206), removing the remaining carrier substrate and forming a gap fill (GF) oxide layer between and over adjacent die within the bottom wafer (207), creating openings in the gap fill oxide layer at the front side of the bottom die and forming metal pads within the openings (208), and forming micro-bumps in contact with the metal pads for chip-package interconnections (CPI) (209).

Referring still to FIG. 2, an act of fusion or direct wafer bonding (step 201) can include performing a van der Waals force bonding process between bonding surfaces of the respective wafers (e.g., carrier wafer 100 and bottom wafer 110). Fusion bonding, for instance, can be performed by hydrolyzing the surfaces of the wafers, aligning the wafers relative to each other, and contacting the wafers together. A grinding or polishing step, such as chemical mechanical polishing, can be used to thin the bottom wafer and expose the conductive contacts (step 202).

Additional semiconductor processing can be used to form bond pad metal (BPM) conductive pads over exposed conductive contacts (step 203). Such processing can include forming a dielectric layer (e.g., oxide layer 120) over the structure resulting from step 202, forming openings in the dielectric layer to expose the conductive contacts (e.g., TSVs 114), forming a conductive layer within the openings, and polishing the resulting structure to remove the conductive layer overburden and form embedded bond pad metal (BPM) contacts (e.g., contacts 124). By way of example, oxide layer 120 can be formed using chemical vapor deposition (CVD). Photolithography and etching processes can be used to form openings in the oxide layer, and the formation of the bond pad metal contacts within the openings can include a physical vapor deposition (PVD) or a chemical vapor deposition (CVD) process.

The carrier wafer can be thinned and individual die can be formed by segmenting the bottom wafer along dicing lanes between active areas (step 204). Example dicing methods include laser dicing and plasma dicing. Turning to steps 205 and 206, the segmented bottom wafer can be oriented and aligned with a top wafer in a face-to-back architecture. The oriented and aligned top and bottom wafers can be hybrid bonded.

At step 207, remaining portions of the carrier wafer can be removed using grinding and/or polishing to expose the front side of the bottom wafer and a gap fill oxide layer can be formed over and between adjacent die. Plasma enhanced atomic layer deposition can be used to form the gap fill oxide layer. The gap fill oxide layer can be planarized and conductive contacts (e.g., metal pads 160) can be formed to chosen active areas within selected die (step 208). A method of forming the metal pads can include patterning and etching openings in the gap fill oxide layer to expose active areas, forming a conductive layer over the gap fill oxide layer and within the openings, and removing the excess conductive material.

The metal pads can be electrically coupled to over-formed solder bumps (e.g., solder bumps 170). Solder bumps can be formed through sequential flow/quench or reflow processes (step 209).

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

The term "approximately" in reference to a particular numeric value or range of values can, in certain implementations, mean and include the stated value as well as all values within 10% of the stated value. Thus, by way of example, reference to the numeric value "50" as "approximately 50" can, in certain implementations, include values equal to 50±5, i.e., values within the range 45 to 55.

The term "substantially" in reference to a given parameter, property, or condition can mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition can be at least approximately 90% met, at least approximately 95% met, or even at least approximately 99% met.

It will be understood that when an element such as a layer or a region is referred to as being formed on, deposited on, or disposed "on" or "over" another element, it can be located directly on at least a portion of the other element, or one or more intervening elements can also be present. In contrast, when an element is referred to as being "directly on" or "directly over" another element, it can be located on at least a portion of the other element, with no intervening elements present.

While various features, elements or steps of particular implementations can be disclosed using the transitional term "comprising," it is to be understood that alternative implementations, including those that can be described using the transitional phrases "consisting of" or "consisting essentially of," are implied. Thus, for example, implied alternative implementations to a gap fill oxide that comprises or includes silicon dioxide include implementations where a gap fill oxide consists essentially of silicon dioxide and implementations where a gap fill oxide consists of silicon dioxide.

What is claimed is:

1. A semiconductor package comprising:
a bottom semiconductor device having an active surface and a back surface;
a through silicon via communicating from the active surface to the back surface;
a bottom bond pad metal contact embedded in a bottom oxide layer overlying the back surface and coupled to the through silicon via;
a top semiconductor device having an active surface and a back surface; and
a top bond pad metal contact embedded in a top oxide layer overlying the active surface of the top semiconductor device, wherein the top semiconductor device and the bottom semiconductor device are positioned face-to-back with the top bond pad metal contact bonded to the bottom bond pad metal contact and the top oxide layer directly bonded to the bottom oxide layer.

2. The semiconductor package of claim 1, wherein the bottom semiconductor device is laterally enveloped by a passivation layer.

3. The semiconductor package of claim 1, wherein the top semiconductor device is formed on and laterally enveloped by a top semiconductor wafer.

4. The semiconductor package of claim 1, comprising metal contacts overlying the active surface of the bottom semiconductor device.

5. The semiconductor package of claim 1, wherein a thickness of the bottom semiconductor device ranges from approximately 15 micrometers to approximately 30 micrometers.

6. The semiconductor package of claim 1, wherein the semiconductor package is free of a carrier wafer.

7. A semiconductor package comprising:
a bottom die having a conductive via extending through the bottom die;
an oxide layer overlying a back surface of the bottom die;
a bond pad metal contact embedded in the oxide layer and communicating with the conductive via;
a top die having an oxide layer overlying a front surface of the top die; and
a bond pad metal contact embedded in the oxide layer, wherein the top die and the bottom die are positioned face-to-back with the top bond pad metal contact bonded to the bottom bond pad metal contact and the top oxide layer directly bonded to the bottom oxide layer.

8. The semiconductor package of claim 7, wherein the bottom die is laterally enveloped by a passivation layer.

9. The semiconductor package of claim 7, wherein the top die is formed on and laterally enveloped by a top semiconductor wafer.

10. The semiconductor package of claim 7, wherein a thickness of the bottom die ranges from approximately 15 micrometers to approximately 30 micrometers.

11. The semiconductor package of claim 7, wherein the semiconductor package is free of a carrier wafer.

12. A method comprising:
fabricating a plurality of semiconductor devices in a region of a bottom wafer adjacent to a front surface of the bottom wafer;
fusion bonding the front surface of the bottom wafer to a carrier substrate;
thinning the bottom wafer opposite to the front surface to expose conductive regions of the semiconductor devices;
forming a dielectric layer over a backside of the semiconductor devices;
forming openings in the dielectric layer to expose the conductive regions;
forming bond pad metal pads within the openings in the dielectric layer and in electrical contact with respective ones of the conductive regions;
dicing the bottom wafer and the carrier substrate to singulate the plurality of semiconductor devices and form a plurality of die;
bonding the dielectric layer overlying the backside of the semiconductor devices to a dielectric layer overlying a front surface of a top wafer;
bonding the bond pad metal pads within the openings in the dielectric layer to metal pads overlying the front surface of the top wafer; and
removing the carrier substrate from the front surface of the bottom wafer.

13. The method of claim 12, wherein the carrier substrate comprises a semiconductor wafer.

14. The method of claim 12, wherein thinning the bottom wafer comprises chemical mechanical polishing.

15. The method of claim 12, wherein dicing the bottom wafer and the carrier substrate comprises laser cutting.

16. The method of claim 12, wherein a thickness of the die ranges from approximately 15 micrometers to approximately 30 micrometers.

17. The method of claim 12, wherein adjacent die on the bottom wafer are separated by a passivation layer and adjacent die on the top wafer are separated a portion of the top wafer.

18. The method of claim 12, further comprising forming a passivation layer over a front surface of the semiconductor devices and within gaps between adjacent semiconductor devices.

19. The method of claim 18, comprising forming openings within the passivation layer and forming metal contacts within the openings and in electrical contact with respective ones of the semiconductor devices.

20. The method of claim 19, comprising forming a solder bump over each metal contact.

\* \* \* \* \*